United States Patent
Anthony et al.

[11] Patent Number: 5,869,133
[45] Date of Patent: Feb. 9, 1999

[54] METHOD OF PRODUCING ARTICLES BY CHEMICAL VAPOR DEPOSITION AND THE SUPPORT MANDRELS USED THEREIN

[75] Inventors: Thomas Richard Anthony; Robert Helmut Ettinger, both of Schenectady; James Fulton Fleischer, Scotia, all of N.Y.

[73] Assignee: General Electric Company, Schenectady, N.Y.

[21] Appl. No.: 119,448

[22] Filed: Sep. 9, 1993

Related U.S. Application Data

[63] Continuation of Ser. No. 899,034, Jun. 15, 1992, abandoned, which is a continuation of Ser. No. 783,457, Oct. 24, 1991, abandoned, which is a division of Ser. No. 694,170, May 1, 1991, abandoned.

[51] Int. Cl.$^6$ .............................. C23C 16/26; C23F 1/26; B32B 9/00
[52] U.S. Cl. .......................... 427/249; 216/100; 216/10; 428/408
[58] Field of Search ................................. 427/249, 255.1, 427/239, 237; 428/408; 155/664, 656, 637; 216/100, 10

[56] References Cited

U.S. PATENT DOCUMENTS

| | | |
|---|---|---|
| 242,900 | 6/1881 | Edison . |
| 3,139,363 | 6/1964 | Baldrey . |
| 3,429,962 | 2/1969 | Krystyniak . |
| 3,863,333 | 2/1975 | Loya ........................................ 156/637 |
| 3,892,827 | 7/1975 | Keller et al. . |
| 3,998,653 | 12/1976 | Anthony et al. ........................ 156/656 |
| 4,062,714 | 12/1977 | Griesshammer et al. . |
| 4,066,485 | 1/1978 | Rosnowski et al. ..................... 156/628 |
| 4,080,246 | 3/1978 | Battisti et al. .......................... 156/656 |
| 4,318,770 | 3/1982 | Chakupurakal ......................... 156/637 |
| 4,816,200 | 3/1989 | Stecher et al. ............................. 264/59 |
| 4,925,701 | 5/1990 | Jansen et al. ........................... 427/249 |
| 4,954,216 | 9/1990 | Hunter et al. ........................... 156/634 |
| 5,023,068 | 6/1991 | Jones ....................................... 423/446 |
| 5,114,745 | 5/1992 | Jones ....................................... 427/113 |

FOREIGN PATENT DOCUMENTS

| | | |
|---|---|---|
| 0400947 | 5/1990 | European Pat. Off. . |
| 6 1106494 -A | 10/1984 | Japan . |
| 59281804 | 7/1986 | Japan . |
| 63026371 | 2/1988 | Japan . |
| 2175696 -A | 12/1988 | Japan . |
| 1-138110 | 5/1989 | Japan . |
| 1138110 | 5/1989 | Japan . |
| 1138111 | 5/1989 | Japan . |
| 1247575 | 10/1989 | Japan . |
| WO901235 | 10/1990 | WIPO . |

OTHER PUBLICATIONS

Harris et al., Journal of Applied Physics, vol. 66, No. 11, Dec. 1, 1989, pp. 5353–5359.

*Primary Examiner*—Shrive Beck
*Assistant Examiner*—Bret B. Chen
*Attorney, Agent, or Firm*—Noreen C. Johnson; Douglas E. Stoner

[57] ABSTRACT

An improved method of producing a diamond tube by chemical vapor deposition and a hollow support mandrel used therein. The method comprises depositing a diamond film on an outer side of the hollow mandrel by the CVD process. The mandrel is then etched away by subjecting an inner side of the mandrel to the etching action. It was unexpectedly discovered that the etch time is drastically reduced by using the hollow mandrels.

5 Claims, 3 Drawing Sheets

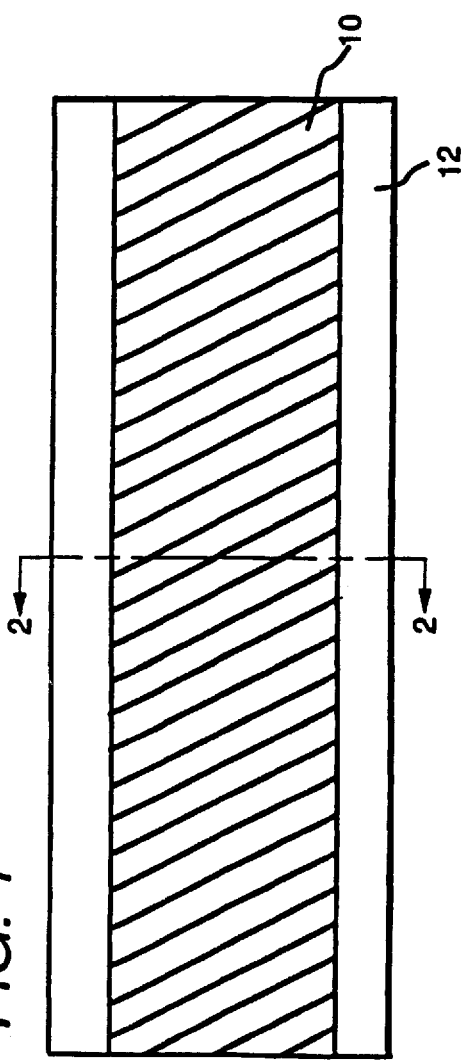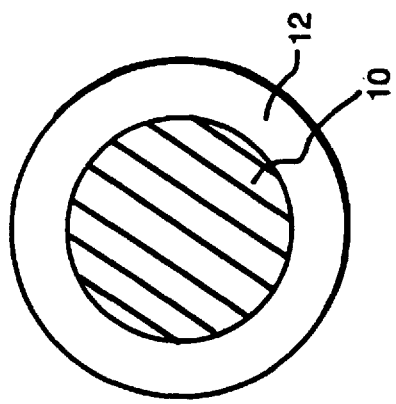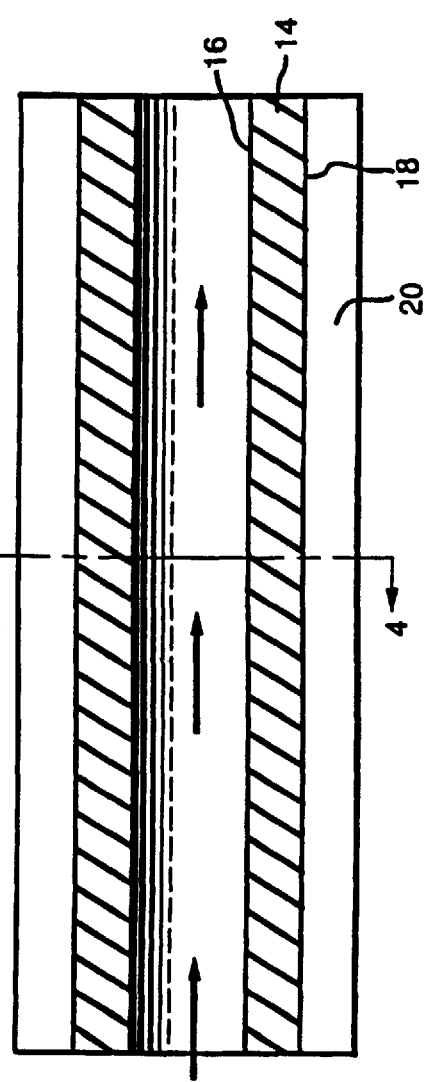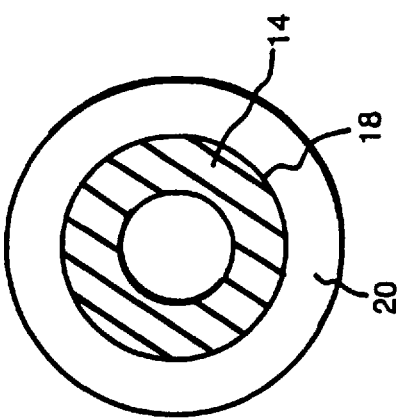

METHOD OF PRODUCING ARTICLES BY CHEMICAL VAPOR DEPOSITION AND THE SUPPORT MANDRELS USED THEREIN

CROSS REFERENCE TO RELATED APPLICATIONS

This application is a continuation of application Ser. No. 07/899,034, filed Jun. 15, 1992, which is a continuation of application Ser. No. 07/783,457, filed Oct. 24, 1991, which in turn is a division of application Ser. No. 07/694,170, filed May 1, 1991, all now abandoned.

Reference is made to co-pending applications, Ser. No. 07/479,329, filed on Feb. 13, 1990, for CVD Diamond Workpieces and Their Fabrication and Ser. No. 07/630,701, filed on Dec. 20, 1990, for Symmetric CVD Diamond Articles and Method of Their Preparation.

FIELD OF THE INVENTION

The present invention generally relates to an improved method used for producing articles by chemical vapor deposition and more particularly concerns an improved support mandrel used in producing diamond water jets and mixing tubes.

BACKGROUND OF THE INVENTION

Diamond is an allotrope of carbon exhibiting a crystallographic network comprising exclusively of covalently bonded, aliphatic $sp^3$ hybridized carbon atoms arranged tetrahedrally with a uniform distance of 1.545 Å between atoms. Diamond is extremely hard having a Mohs hardness of 10. It exhibits four times the thermal conductivity of copper and it is electrically insulating. Its hardness and thermal properties are but two of the characteristics that make diamond useful in a variety of industrial components. Initially non-gem quality natural diamonds were used in a variety of abrasive applications but with the invention of synthetic diamonds by high pressure/high temperature techniques, a spectrum of additional products have found favor in the marketplace. However, the requirement of high pressure and high temperature has been a limitation in preventing extensive usage of synthetic diamonds.

Recent industrial efforts directed toward the growth of diamonds at low pressures has dramatically increased the feasibility of using diamonds in various industrial applications. Low pressure growth of diamond has been dubbed "chemical vapor deposition" or "CVD" in the field. In the CVD process diamonds are grown at low pressures from hydrocarbon gases in the presence of atomic hydrogen. Many methods have been disclosed for growing diamonds metastably and generally these methods differ from each other by the way in which atomic hydrogen, a key reactant, is generated and transported within the system. One of such methods called a "filament method" involves the use of a mixture of a gaseous carbon compound such as methane and hydrogen. The gas mixture is introduced into a substantially evacuated reaction chamber via a quartz tube located just above a hot filament. The hydrogen from the gas mixture dissociates at the filament surface into atomic hydrogen which then reacts with the carbon compound to form condensable carbon radicals including elemental carbon onto a heated substrate.

Another method involves a plasma discharge in addition to the filament. The plasma discharge serves to increase the nucleation density and growth rate and, it is believed, to enhance formation of diamond films as opposed to discrete diamond particles. Of the plasma systems that have been utilized in this area, there are three basic systems. One is microwave plasma system, the second is an RF (inductively or capacitively coupled) plasma system and the third is a d.c. arc plasma system.

When a free standing diamond film is required, the underlying substrate may be etched out by conventional etching techniques, such as exposing the substrate to the etching acids. For a general summary of various diamond deposition methods including CVD methods, reference is made to Bachmann, et al., *Diamond Thin Films*, Chemical & Engineering News, 67(20), 24–39 (May 15, 1989), incorporated herein by reference.

Various problems have been encountered in producing free standing CVD diamond deposition films. For example, a long etch time, up to ten days, is required to etch away the underlying substrate, such as a solid molybdenum mandrel of about 0.102 centimeters in diameter and about 15.24 centimeters in length, upon which a diamond tube is formed. In addition to the long etch times, it is also found that the reaction products formed at the interface between the mandrel being etched and the deposited diamond cause swelling and cracking of the diamond tube.

STATEMENT OF THE INVENTION

The present invention is directed to an improved support member used for producing an article thereon by a chemical vapor deposition process comprising a hollow structure having an inner and an outer side.

The present invention is also directed to an improved method of producing an article by a chemical vapor deposition comprising, conveying a gaseous mixture of hydrogen and a carbon compound into a CVD reaction chamber, energizing the mixture to degrade it into fragments, depositing the fragments onto a surface of a thermally stable hollow substrate having an inner side and an outer side wherein the outer side has a shape substantially similar to the shape of the article, condensing the fragments on the surface, placing the substrate having the article formed thereon in an etching bath, and agitating the etching bath to etch away the substrate along the inner side of the substrate to produce the article. If desired the fragments may be deposited on the inner side of the surface of the substrate so long as some portion of the surface is exposed to the etchant.

Other advantages of the invention will become apparent upon reading the following detailed description and appended claims, and upon reference to the accompanying drawings.

BRIEF DESCRIPTION OF THE DRAWINGS

For a more complete understanding of this invention reference should now be had to the embodiments illustrated in greater detail in the accompanying drawings and described below by way of examples of the invention.

FIG. 1 is a cross-sectional view of a solid mandrel used in the prior art.

FIG. 2 is a cross-sectional view of the prior art of FIG. 1 taken along plane 2—2.

FIG. 3 is a cross-sectional view of the preferred embodiment of the present invention.

FIG. 4 is a cross-sectional view of the preferred embodiment of FIG. 3 taken along plane 4—4.

While the invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

DETAILED DESCRIPTION OF THE PREFERRED EMBODIMENT

In recent years, the synthesis of free standing articles made from diamond films has been extensively researched. One of the major problems associated with producing such free standing articles is a method by which the underlying substrate is removed. The removal of the substrate becomes even more difficult when hollow articles, such as the diamond tubes used in the high pressure cutting machines utilizing water jets are prepared. A preferred etching bath comprises a heated etchant preferably comprising a mixture in equal parts of hydrochloric acid having a concentration of about 36% to about 38% by weight in water, nitric acid having a concentration of about 69% to about 71% by weight in water and hydrofluoric acid having a concentration of about 49% to about 51% by weight in water. The aforementioned etching bath is preferably heated to about 110° Centigrade to about 120° Centigrade. An alternative etchant comprises a mixture of three parts by weight of nitric acid having a concentration of about 69% to about 71% and one part by weight of hydrochloric acid having a concentration of about 36% to about 38%. However to these skilled in the art, it will be obvious to substitute any other etchant suitably matched to react with the substrate being etched. The etching bath is preferably maintained at a temperature of about 5° Centigrade to about 10° Centigrade below the boiling point of the selected etchant.

The etching bath is agitated to dislodge the bubbles formed along the face of the substrate being etched. If the bubbles are not dislodged from the face being etched, further etching action ceases. Therefore by dislodging the bubbles, the etching action is sustained. The bubbles may be dislodged by providing an ultrasonic agitation to the etching bath. Typically the etch times are determined in accordance with a diffusion equation, $$X^2 = Dt$$

where X is the diffusion distance in centimeters, D is the diffusion coefficient of the liquid in centimeters$^2$ per second and t is the etch time required in seconds to etch out X length of substrate. It should be understood that the present invention does not rely on the aforementioned diffusion equation and therefore no dependence thereon is intended.

Figure 5:
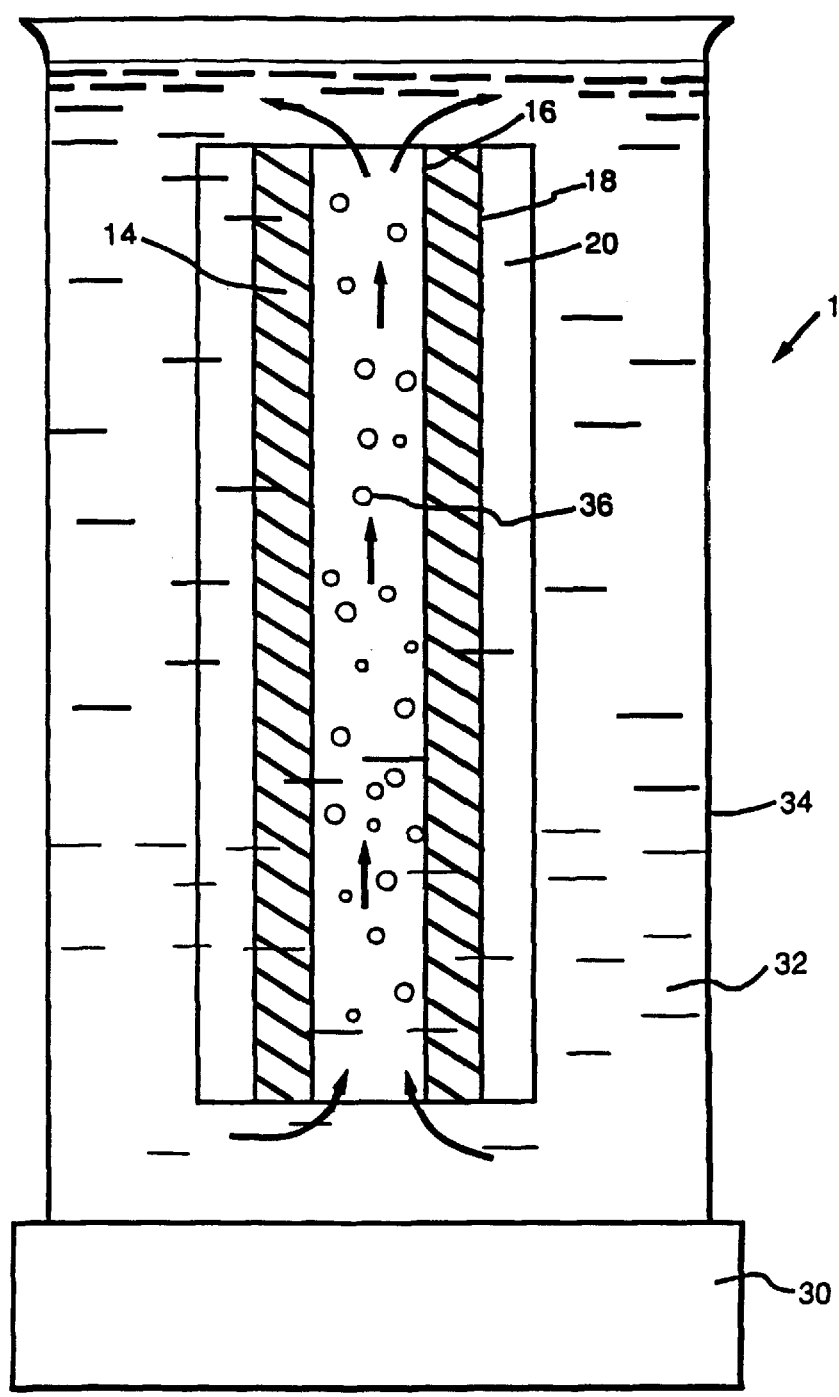
FIG. 5 illustrates an exemplary etching apparatus used for removal of the support mandrel.

Turning now to FIGS. 1 and 2, there is shown a support mandrel 10 of the prior art having a solid core upon which a diamond tube 12 is formed by the CVD process. As can be seen in FIGS. 1 and 2, it is difficult to etch away the solid core since the face upon which the etching action takes place is confined within the tubular shape of diamond tube 12 and therefore it is difficult to freely circulate the etchant to the face being etched. The preferred embodiment of the present invention, as shown in FIGS. 3 and 4, is a hollow support mandrel 14 having a smooth inner side 16 and an outer side 18. Typically outer side 18 is provided with a high polish. A diamond film 20 is formed on outer side 18. It has been unexpectedly discovered that by using hollow support mandrel 14 the etch time to dispose of mandrel 14 can be reduced drastically. As shown by the arrows in FIG. 3, the etchant can be provided with an efficient passage along inner side 16 of mandrel 14, thereby improving the etching action. FIG. 5 illustrates a preferred etching bath, generally represented by a numeral 1. Etching bath 1 is provided with an etchant 32 placed within an etching bath container 34. Hollow support mandrel 14 of FIG. 3 is preferably submerged vertically within etchant 32. As etchant 32 reacts with the metal of hollow support mandrel 14, the bubbles 36 formed along inner side 16 of hollow support mandrel 14 percolate through an upper end of hollow support mandrel 14, thus inducing a natural convective flow of etchant 32 along inner side 16 of mandrel 14. Under such conditions, the ultrasonic agitation of the etchant may not be needed. However, etching bath 1 may be optionally provided with a suitable ultrasonic agitating device 30 used for agitating an etchant 32, if desired. Another advantage of hollow mandrel 14 is that a lesser amount of metal needs to be etched as compared to solid mandrel 10, shown in FIG. 1. By way of example, it took about 7.5 to about 10 days to etch away a solid molybdenum mandrel of the prior art having about 0.102 centimeters diameter and about 15.24 centimeters length, using the aforementioned preferred etchant. If the solid mandrel is replaced with a hollow mandrel, having the same external dimensions as the solid mandrel, e.g. about 15.24 centimeters long and about 0.102 centimeters in diameter and having an inner diameter of about 0.061 centimeters, the etch time dropped to about 10 minutes. Therefore, there occurs an unexpectedly significant reduction in the etch time when hollow mandrel 14 of FIG. 3 is employed. It is contemplated that hollow mandrel 14 may also be etched by connecting the open ends of hollow mandrel 14 to an intake and an outtake conduit used for carrying the etchant. It is further contemplated that the open ends of a group of hollow mandrels 14 may connected to the intake and outtake junction boxes for simultaneously transporting the etchant along inner sides 16 of hollow mandrels 14, thereby increasing the productivity of the etching action.

The present invention is also directed to an improved method of producing stand-alone diamond articles by the CVD process wherein hollow substrates are used as targets upon which diamond films are deposited. In the CVD process useful in the present invention, a gaseous mixture of hydrogen and a carbon compound is conveyed into a CVD reaction chamber. The gaseous carbon compound includes saturated hydrocarbons, such as methane, ethane, propane and unsaturated hydrocarbons, such as ethylene, acetylene, cyclohexene. It is also contemplated that carbon compounds such as benzene may be used in their vaporized state. Methane, is however, preferred. The molar ratio of hydrocarbon to hydrogen broadly ranges from about 1:10 to about 1:1000, preferably at 1:100. The gaseous mixture may be optionally diluted with an inert gas such as argon or helium. Pressures in the CVD chamber in the range of about 0.01 Torr to about 1000 Torr, preferably about 1 Torr to about 800 Torr, are taught in the art.

The gaseous mixture is then energized to degrade it into fragments. The mixture is preferably energized by passing it over a heated non-reactive filament, heated to a temperature ranging from between about 1750° Centigrade to about 2400° Centigrade. Such a filament is formed of tungsten, molybdenum, tantalum, or alloys thereof. Tungsten is preferred. U.S. Pat. No. 4,707,384, incorporated herein by reference, illustrates this process. The substrate may be optionally bombarded with electrons during the CVD process in accordance with U.S. Pat. No. 4,740,263, incorporated herein by reference.

The substrate is maintained at an elevated temperature of about 500° Centigrade to about 1100° Centigrade, preferably at about 850° Centigrade to about 950° Centigrade. The substrate may be made of thermally stable metals, such as titanium, zirconium, hafnium, vanadium, niobium, tantalum, chromium, molybdenum, tungsten, manganese, rhenium, iron, rubidium, osmium, cobalt, rhodium, indium, nickel, palladium, platinum, copper, silver, gold, and alloys thereof; ceramics, such as silicon carbide, boron nitride, aluminum nitride; carbon (e.g. graphite) or silicon. Molybdenum is preferred. It should be noted that unlike substrate materials such as molybdenum, some substrate materials such as chromium need to be prepared before they can be subjected to diamond deposition. The preparation step comprises, for example, contacting, for about 5 minutes, the substrate with an agitated suspension in alkanol of diamond particles having a size of about one micron. An ultrasonically agitated suspension of diamond particles in ethyl alcohol is preferred. Alternatively, the substrate may be rubbed with a suspension of diamond particles having a size of about one micron in hydrocarbon oil until the surface of the substrate turns cloudy. The substrates, such as thin tubes, may have to be supported by means of supports, such as rods passing through the thin tubes, to prevent distortion of these tubes during deposition of the fragments along their outer surfaces. Details of CVD processes are additionally reviewed in Angus et al., *Low-Pressure Metastable Growth of Diamond and 'Diamondlike' Phases*, Science, Vol. 241(Aug. 19, 1988), pages 913–921, incorporated herein by reference.

Figure 6:
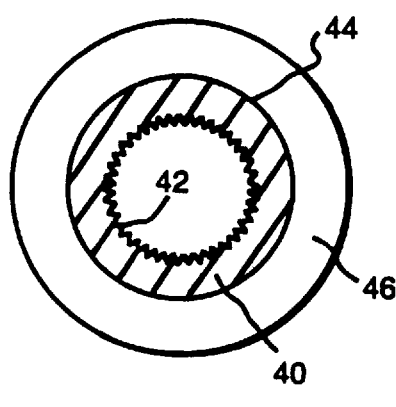
FIG. 6 shows a cross-sectional view of another embodiment of the present invention.

Another embodiment of the present invention is shown in FIG. 6. A mandrel 40 is provided with a deposit of diamond film 46 on an outer side 44 An inner side 42 is provided a serrated shape to accelerate the etching action of etchant 32, shown in FIG. 5.

Figure 7:
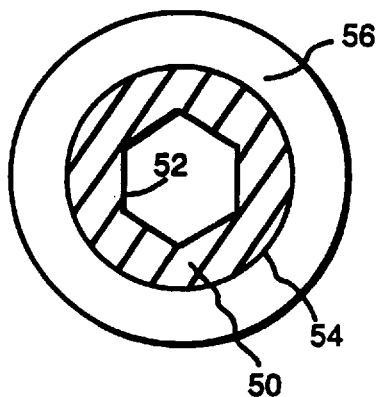
FIG. 7 shows a cross-sectional view of still another embodiment of the present invention.

Still another embodiment of the present invention is shown in FIG. 7. A mandrel 50 is provided with a deposit of diamond film 56 on an outer side 54. An inner side 52 is provided with a polygonal shape.

Figure 8:
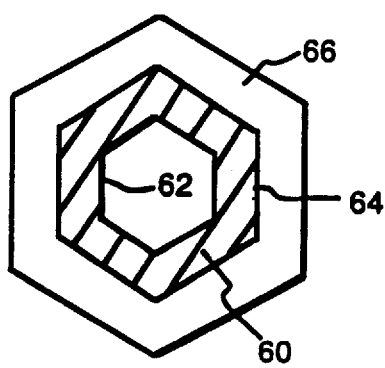
FIG. 8 shows a cross-sectional view of yet another embodiment of the present invention.

Yet another embodiment of the present invention is shown in FIG. 8. A mandrel 60 is provided with a deposit of diamond film 66 on an outer side 64 having a polygonal shape. An inner side 62 is also provided with a polygonal shape to provide mandrel 60 with a uniform wall thickness.

Figure 9:
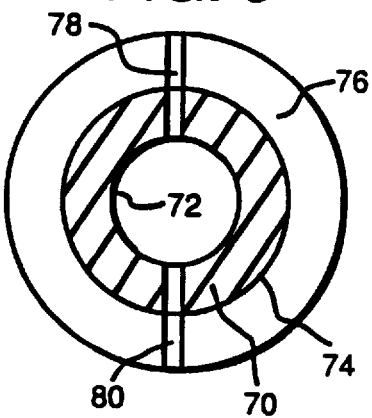
FIG. 9 shows a cross-sectional view of still another embodiment of the present invention.

Still another embodiment of the present invention is shown in FIG. 9. A substrate 70 is spherical in shape, with a deposit of diamond film 76 on an outer side 74 of substrate 70. An inner side 72 is etched out by passing etchant 32, shown in FIG. 5, through an intake orifice 78 and an outtake orifice 80.

The present invention may be used, for example in producing fluid nozzles, fluid mixing tubes, heat sinks for integrated circuit chips, wire guides for electrical discharge machines, thread guides for textile machinery and test tubes. In addition to diamond, the present invention may also used to deposit silicon, germanium, boron, aluminum, zirconium, tungsten, titanium and molybdenum.

The aforementioned specific examples are intended for illustrative purposes only and should not be construed as limitations upon the broadest aspects of the invention. While particular embodiments of the invention have been shown, it will be understood, of course, that the invention is not limited thereto since modifications may be made by those skilled in the art, particularly in light of the foregoing teachings. It is, therefore, contemplated by the appended claims to cover any such modifications as incorporate those features which constitute the essential features of these improvements within the true spirit and scope of the invention.

What is claimed is:

1. A method of producing a diamond article comprising:

depositing a diamond layer by chemical vapor deposition on a surface of a thermally stable substrate consisting of a tube open at both ends and having an inner surface and an outer surface, said outer surface having a shape substantially the same as that of the desired interior of said diamond article, while supporting said substrate to prevent distortion thereof; and submerging said substrate and diamond layer in a vertical position in an etching bath and ultrasonically agitating said etching bath to remove said substrate by etching of the inner surface thereof.

2. The method according to claim 1 wherein said substrate is supported by a rod.

3. The method according to claim 2 wherein said substrate is molybdenum.

4. The method according to claim 1 wherein said substrate is etched by a bath comprising a mixture in equal parts of aqueous hydrochloric acid having a concentration of about 36–38%, aqueous nitric acid having a concentration of about 69–71% by weight and aqueous hydrofluoric acid having a concentration of about 49–51%, all percentages being by weight.

5. A method of producing a diamond tube comprising:

depositing a diamond layer by chemical vapor deposition on a surface of a hollow tubular molybdenum mandrel open at both ends and having an inner surface and an outer surface, said outer surface having a shape substantially the same as that of the desired interior of said diamond tube;

supporting said mandrel on a rod passing through said mandrel during deposition of said diamond layer to prevent distortion of said mandrel;

placing said mandrel having said diamond tube formed thereon in a vertical position in an etching bath comprising a mixture in equal parts of aqueous hydrochloric acid having a concentration of about 36–38%, aqueous nitric acid having a concentration of about 69–71% and aqueous hydrofluoric acid having a concentration of about 49–51%, all parts being by weight; and ultrasonically agitating said etching bath to etch away said mandrel along the inner surface thereof and produce said diamond tube.

* * * * *